(12) United States Patent
Nakashiba

(10) Patent No.: US 7,714,409 B2
(45) Date of Patent: May 11, 2010

(54) SEMICONDUCTOR DEVICE

(75) Inventor: Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 363 days.

(21) Appl. No.: 11/802,644

(22) Filed: May 24, 2007

(65) Prior Publication Data

US 2007/0273015 A1    Nov. 29, 2007

(30) Foreign Application Priority Data

May 29, 2006    (JP)    ............... 2006-148187

(51) Int. Cl.
*H01L 27/02* (2006.01)
(52) U.S. Cl. ............... 257/531; 257/E27.009
(58) Field of Classification Search ............... 257/213, 257/256, 272, 275, 277, 499, 528, 531, 678, 257/679, 685, 686, E27.001, E27.009
See application file for complete search history.

(56) References Cited

U.S. PATENT DOCUMENTS 6,201,289 B1 *   3/2001   Jou ............... 257/531

FOREIGN PATENT DOCUMENTS

JP    2005-228981    8/2005

* cited by examiner

*Primary Examiner*—Sue Purvis
*Assistant Examiner*—Kevin Quinto
(74) *Attorney, Agent, or Firm*—Young & Thompson

(57) ABSTRACT

A semiconductor device 1 includes a semiconductor chip 10. Each of the semiconductor chips 10 includes a semiconductor substrate 12, a semiconductor layer 14 and an interconnect layer 16. The semiconductor substrate 12 has a specific resistance $\rho 1$ (first specific resistance). A semiconductor layer 14 is provided on the semiconductor substrate 12. Such semiconductor layer 14 exhibits a specific resistance $\rho 2$ (second specific resistance). The relationship of these specific resistances is: $\rho 2 < \rho 1$. The interconnect layer 16 is provided on the semiconductor layer 14. An inductor 18 for transmitting and receiving signals with an external element outside the semiconductor chip 10 is provided in the interconnect layer 16.

20 Claims, 3 Drawing Sheets

SEMICONDUCTOR DEVICE

This application is based on Japanese patent application No. 2006-148,187, the content of which is incorporated hereinto by reference.

BACKGROUND

1. Technical Field

The present invention relates to a semiconductor device.

2. Related Art

A plurality of semiconductor chip are deposited in a semiconductor device disclosed in Japanese Patent Laid-Open No. 2005-228,981. Each of the semiconductor chips is provided with an inductor for a communication. Each of the inductors are configured of an interconnect in an interconnect layer provided on the semiconductor substrate such as a silicon substrate and the like. The inductors are mutually inductively-coupled, which allows transmitting and receiving a signal between the chips.

The present inventor has recognized as follows. In the above-described semiconductor device, an eddy current is generated in the semiconductor substrate by a magnetic field of the inductors. Then, according to Lenz's law, a new magnetic field, which is oriented to neutralize the above-described magnetic field, is generated due to the eddy current, leading to a reduced strength of the magnetic field. The reduced strength of the magnetic field may cause a reduced available communication distance for transmitting and receiving a signal.

SUMMARY

According to one aspect of the present invention, there is provided a semiconductor device, comprising a semiconductor chip, which has: a semiconductor substrate having a first specific resistance; a semiconductor layer, provided on the semiconductor substrate and having a second specific resistance, which is lower than the first specific resistance; and an interconnect layer provided on the semiconductor layer, wherein an inductor for transmitting or receiving a signal between the semiconductor chip and an external element is provided in the interconnect layer of the semiconductor chip.

In such semiconductor device, a semiconductor substrate having larger specific resistance than the semiconductor layer is employed. This allows reducing an eddy current generated in the semiconductor substrate by a magnetic field of the inductor. Therefore, a magnetic field generated by eddy current and oriented to neutralize the above-described magnetic field is also reduced, thereby inhibiting a decrease in the strength of the magnetic field of the inductor.

According to the present invention, a semiconductor device, which is capable of reducing an eddy current generated in a semiconductor substrate by a magnetic field of an inductor, can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of semiconductor devices according to the present invention will be described in reference to the annexed figures. In all figures, identical numeral is assigned to an element commonly appeared in the description of the present invention in reference to the figures, and the detailed description thereof will not be repeated.

First Embodiment

Figure 1:
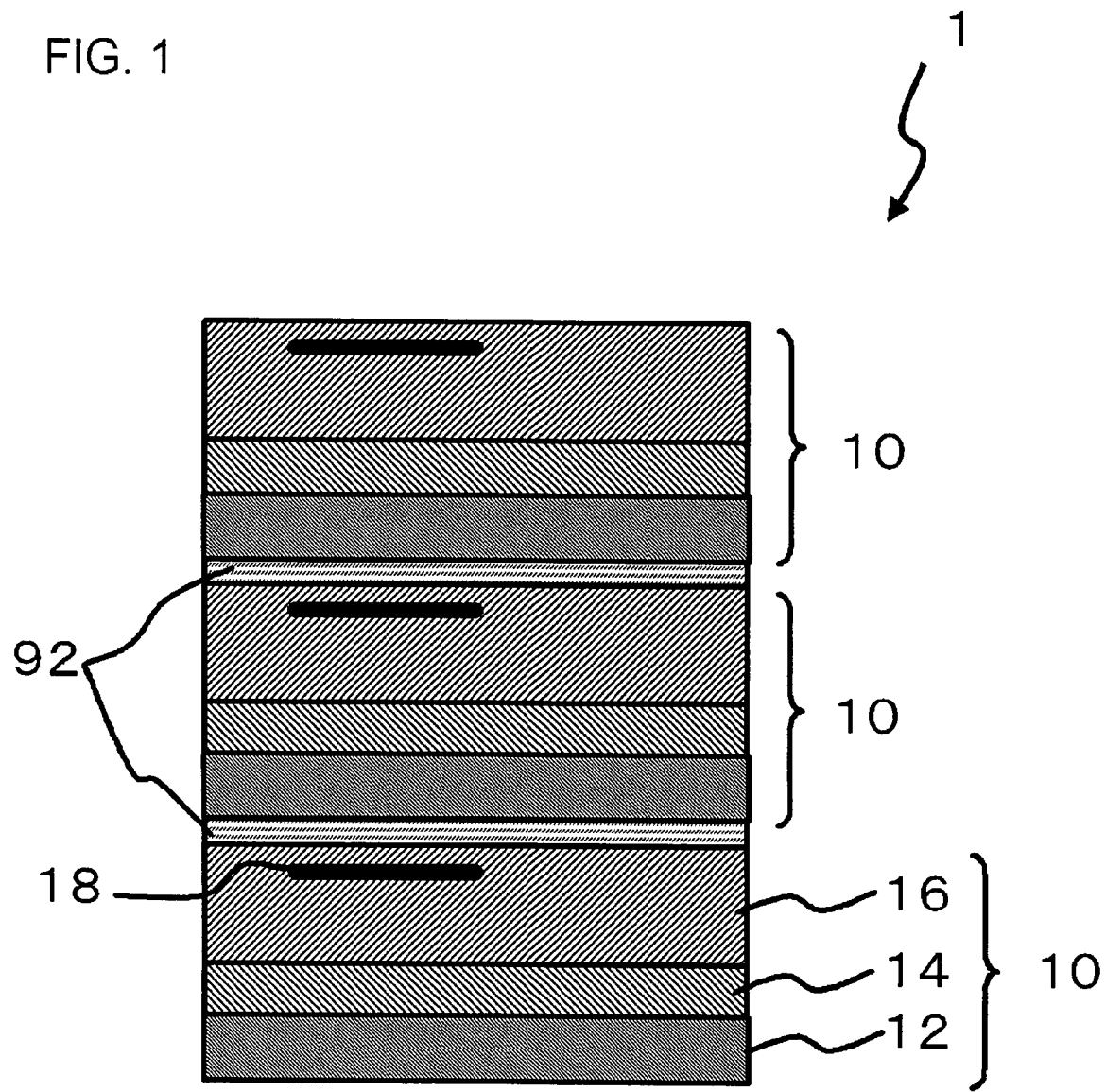
FIG. 1 is a cross-sectional view, showing first embodiment of a semiconductor device according to the present invention.

FIG. 1 is a cross-sectional view, showing first embodiment of a semiconductor device according to the present invention. A semiconductor device 1 includes a semiconductor chip 10. In the present embodiment, three semiconductor chips 10 are stacked. The semiconductor chips 10 are adhered with adhesive agents 92.

Each of the semiconductor chips 10 includes a semiconductor substrate 12, a semiconductor layer 14 and an interconnect layer 16. The semiconductor substrate 12 is, for example, a silicon substrate. The semiconductor substrate 12 has a specific resistance $\rho 1$ (first specific resistance). A typical value of $\rho 1$ is, for example, 1,000 $\Omega$cm. Preferably, the specific resistance may be presented as: $\rho 1 \geqq 200$ $\Omega$cm, and more preferably, $\rho 1 \geqq 500$ $\Omega$cm.

A semiconductor layer 14 is provided on the semiconductor substrate 12. The semiconductor layer 14 is, for example, a silicon layer formed by an epitaxial growing process. Such semiconductor layer 14 exhibits a specific resistance $\rho 2$ (second specific resistance). The relationship of these specific resistances is: $\rho 2 < \rho 1$. A typical value of $\rho 2$ is, for example, 10 $\Omega$cm. Preferably, the specific resistance may be presented as: 5 $\Omega$cm $\geqq \rho 2 \geqq 100$ $\Omega$cm.

The interconnect layer 16 is provided on the semiconductor layer 14. An inductor 18 for transmitting and receiving signals with an external element outside the semiconductor chip 10 is provided in the interconnect layer 16. An interconnect, which is not shown here, is provided in the interconnect layer 16. The inductor 18 is configured of a portion of the interconnect, which is manufactured by forming such portion to a coil-shape. In addition to above, one of, or both of, an inductor for transmission and an inductor for reception may be provided in the interconnect layer 16.

In the present embodiment, a plurality of semiconductor chips 10 are provided as described above. Those inductors 18 are provided in positions corresponding to the respective semiconductor chips 10 so as to provide inductive coupling therebetween. Specifically, the inductors 18 are provided in the positions, which provide overlaps of these inductors in plan view.

A signal processing circuit (not shown) for processing signals transmitted or received by the inductor 18 is formed in the semiconductor layer 14. Further, an integrated circuit including the above-described signal processing circuit is formed in the semiconductor layer 14.

Advantageous effects obtainable by employing the configuration of the present embodiment will be described. The semiconductor device 1 employs the semiconductor substrate 12 having larger specific resistance than that of the semiconductor layer 14. This allows reducing an eddy current generated in the semiconductor substrate 12 by a magnetic field of the inductor 18. Therefore, a magnetic field generated by eddy current and oriented to neutralize the above-described magnetic field is also reduced, thereby inhibiting a decrease in the strength of the magnetic field of the inductor 18. Thus, a decrease in the available communication distance for transmitting and receiving a signal can be inhibited. Further, in case of transmitting and receiving signals for the same communication distance, the transmission and the reception can be achieved with lower electric power than the conventional device.

In particular, when the specific resistance is: $\rho 1 \geq 200$ $\Omega$cm, considerable advantageous effect of inhibiting such eddy current can be obtained. Further, when the specific resistance is: $\rho 1 \geq 500$ $\Omega$cm, further considerable level of such advantageous effect can be obtained.

The inductor 18 is composed of the interconnect in the interconnect layer 16 formed to be electric coil-shaped. This allows an easy provision of the inductor 18 in the semiconductor chip 10.

The integrated circuit including the signal processing circuit is formed in the semiconductor layer 14. Therefore, even if the thickness of the whole substrate (multiple-layered structure composed of the semiconductor substrate 12 and the semiconductor layer 14 in this case) is selected to be thicker than that of the semiconductor device disclosed in Japanese Patent Laid-Open No. 2005-228,981, a transmitting and receiving performances, which is equivalent to or better than the semiconductor device of the Japanese Patent Laid-Open No. 2005-228,981 can be obtained. Thus, sufficient mechanical strength of the semiconductor chip 10 can be ensured. Excessively smaller thickness of the substrate may lead to a bending of the substrate due to an influence of stress, thereby possibly deteriorating the characteristics of the semiconductor device such as transistors and the like.

In particular, when the specific resistance is: 5 $\Omega$cm$\leq \rho 2 \leq 100$ $\Omega$cm, a manufacture of the above-described integrated circuit is facilitated. This is because the manufacture can be achieved by employing the existing device processes as they are without any modification.

When the semiconductor layer 14 is formed by an epitaxial growing process, or in other words, when the semiconductor layer 14 is an epitaxial layer, the semiconductor layer 14 having smaller specific resistance than the semiconductor substrate 12 can be easily formed.

The configuration also includes a plurality of semiconductor chips 10 provided therein so that the inductors 18 thereof provide inductive coupling therebetween. This allows a preferable transmission and reception of a signal between the semiconductor chips.

Second Embodiment

Figure 2:
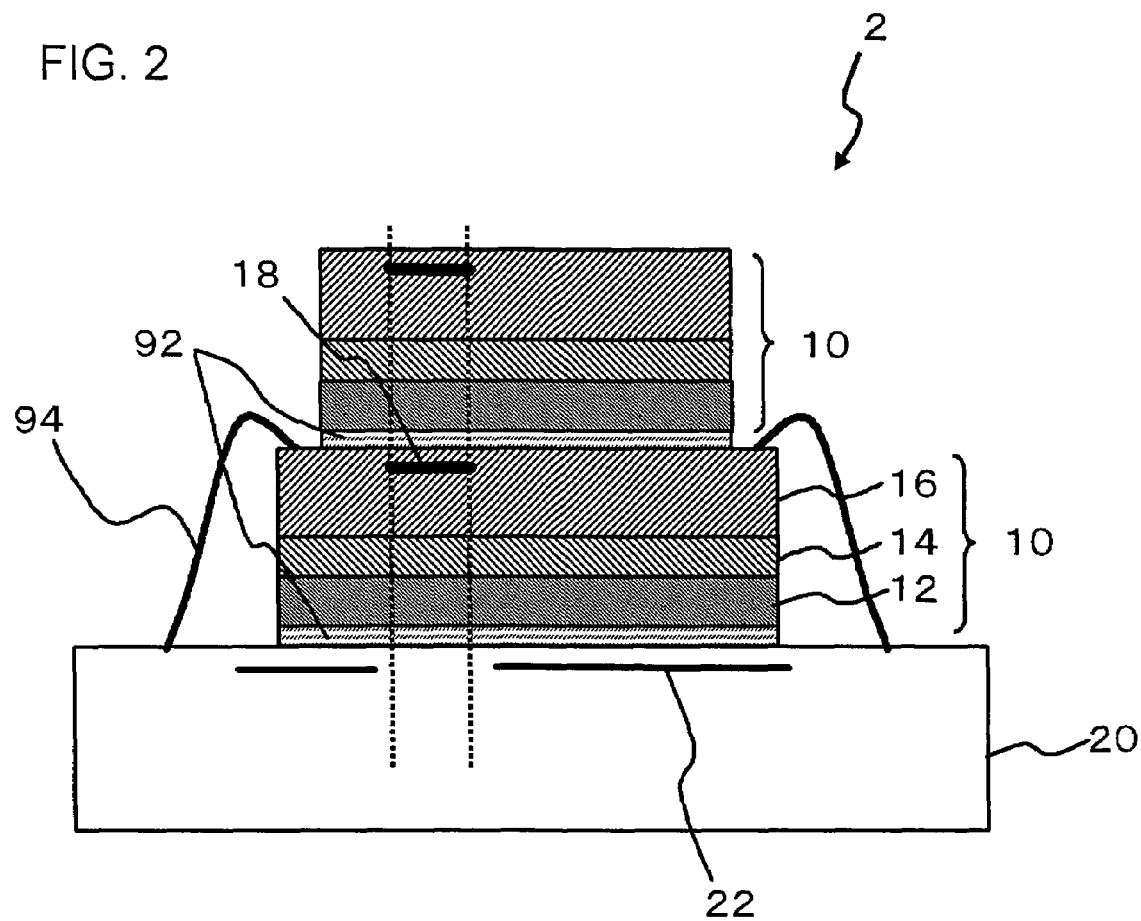
FIG. 2 is a cross-sectional view, showing second embodiment of a semiconductor device according to the present invention.

FIG. 2 is a cross-sectional view, showing second embodiment of a semiconductor device according to the present invention. A semiconductor device 2 comprises a semiconductor chip 10 and a printed circuit board 20. A configuration of the semiconductor chip 10 is equivalent to that described in reference to FIG. 1. In the present embodiment, two semiconductor chips 10 are stacked, and the semiconductor chip 10 in the bottom layer is attached to the printed circuit board 20 by a wire bonding. More specifically, the semiconductor chip 10 of the bottom layer is electrically coupled with the printed circuit board 20 by a wire 94. A coupling between the semiconductor chips 10 and a coupling of the semiconductor chip 10 with the printed circuit board 20 are achieved by the adhesive agent 92.

The interconnect 22 of the printed circuit board 20 is provided in a region that has no portion overlapping with the inductor 18 of the semiconductor chip 10 in plan view. More specifically, the interconnect 22 is disposed to escape the lower portion of the inductor 18.

Such configuration allows preventing a generation of an eddy current in the interconnect 22 due to the magnetic field of the inductor 18. A generation of an eddy current in the interconnect 22 causes a decrease in the strength of the magnetic field of the inductor, similarly as in the case that the eddy current is generated in the semiconductor substrate 12. Other advantageous effects of semiconductor device 2 are similar to that of the semiconductor device 1.

Third Embodiment

Figure 3:
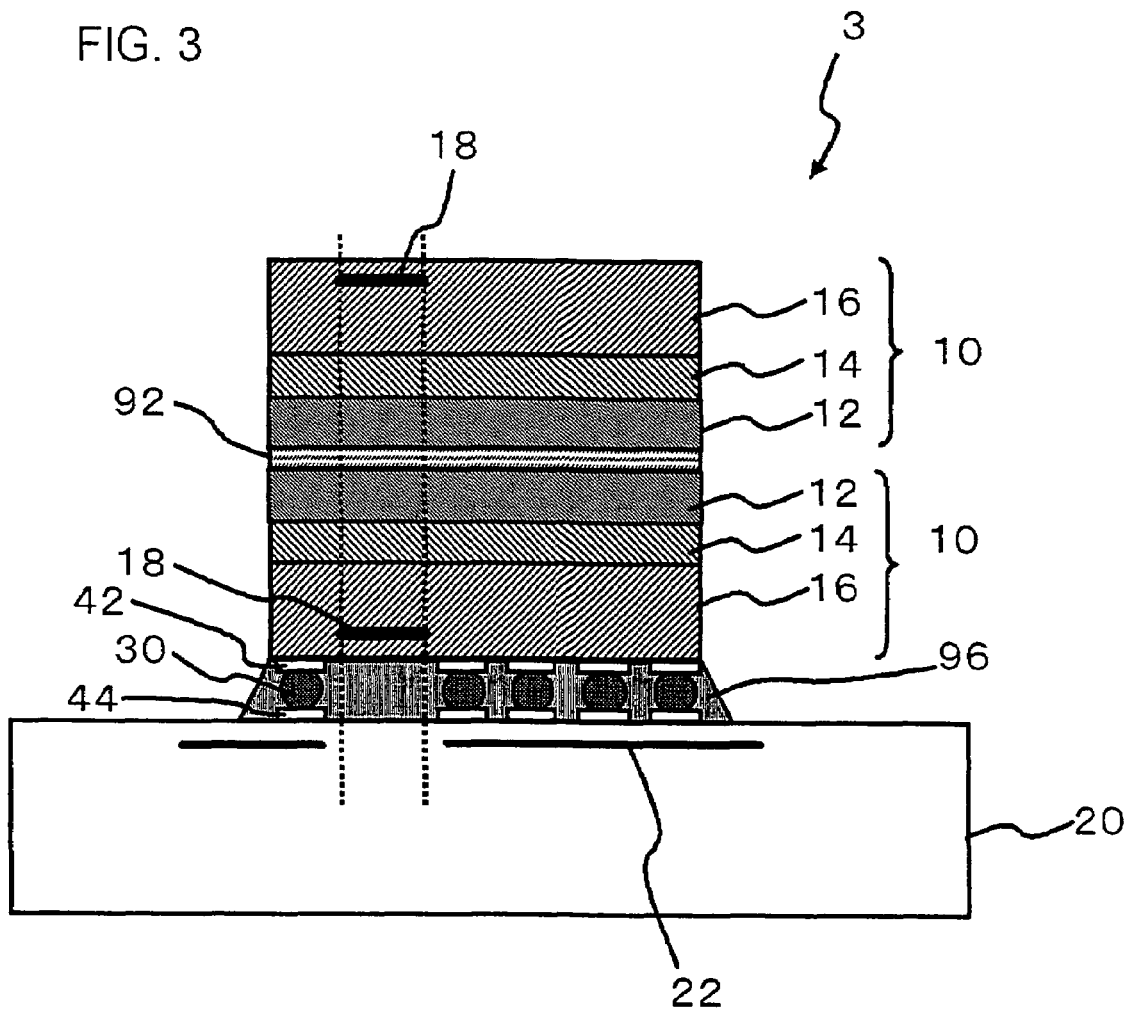
FIG. 3 is a cross-sectional view, showing third embodiment of a semiconductor device according to the present invention.

FIG. 3 is a cross-sectional view, showing third embodiment of a semiconductor device according to the present invention. A semiconductor device 3 comprises a semiconductor chip 10 and a printed circuit board 20. A configuration of the semiconductor chip 10 is equivalent to that described in reference to FIG. 1. Further, a configuration of the printed circuit board 20 is equivalent to that described in reference to FIG. 2. In the present embodiment, two semiconductor chips 10 are stacked, and the semiconductor chip 10 in the bottom layer is attached to the printed circuit board 20 by a flip chip bonding. More specifically, the semiconductor chip 10 of the bottom layer is coupled to the printed circuit board 20 by a bump 30, in a situation that the interconnect layer 16 thereof is oriented toward the printed circuit board 20. Specifically, an electroconductive pad 42 (first pad) and an electroconductive pad 44 (second pad) are formed in each of the semiconductor chip 10 and the printed circuit board 20, and the bump 30 interposes between both pads 42 and 44. Further, a spacing between the semiconductor chip 10 and the printed circuit board 20 is filed with an underfill resin 96. A coupling between the semiconductor chips 10 is achieved by the adhesive agent 92.

The bump 30 is provided in a region that has no portion overlapping with the inductor 18 in plan view. More specifically, the bump 30 is disposed to escape the lower portion of the inductor 18. The bump 30 is formed of, for example, solder or gold. Further, the pads 42 and 44 are provided in regions that have no portion overlapping with the inductor 18 in plan view.

Such configuration allows preventing a generation of an eddy current in the bump 30 and/or the pads 42 and 44 due to the magnetic field of the inductor 18. A generation of an eddy current in the bump 30 and/or the pads 42 and 44 causes a decrease in the strength of the magnetic field of the inductor, similarly as in the case that the eddy current is generated in the semiconductor substrate 12. Other advantageous effects of semiconductor device 3 are similar to that of the semiconductor device 2. Here, the present embodiment represents the exemplary implementation, in which all the interconnect 22, the bump 30 and the pads 42 and 44 are disposed to escape the lower portion of the inductor 18. Alternatively, only portions of these may be disposed to escape the lower portion of the inductor 18.

It is not intended that the semiconductor devices according to the present invention is limited to the configurations illustrated in the above-described embodiments, and various modifications thereof are available. For example, the exemplary implementation employing a plurality of semiconductor chip 10 provided therein is illustrated in the above-described embodiment. Alternatively, only one semiconductor chip 10 may be provided. Further, the transmission and the reception of signals by the inductor 18 may not be limited to the case of the communication between the semiconductor chips 10, and may be performed between the semiconductor chip 10 and other components.

It is apparent that the present invention is not limited to the above embodiment, and may be modified and changed without departing from the scope and spirit of the invention.

What is claimed is:

1. A semiconductor device, comprising:
   a semiconductor chip, said semiconductor chip comprised of
   a semiconductor substrate having a first specific resistance,
   a semiconductor layer provided on said semiconductor substrate and having a second specific resistance, said second specific resistance being lower than said first specific resistance,
   an interconnect layer provided on said semiconductor layer provided with an inductor in said interconnect layer for transmitting or receiving a signal between the semiconductor chip and an external element, and
   a signal processing circuit formed in said semiconductor layer for processing said signal transmitted or received by said inductor.

2. The semiconductor device as set forth in claim 1, wherein said inductor is configured of interconnects in said interconnect layer, said interconnects being formed to have a coil-shape.

3. The semiconductor device as set forth in claim 1, wherein an integrated circuit having said signal processing circuit is formed in said semiconductor layer.

4. The semiconductor device as set forth in claim 1, wherein said semiconductor layer is an epitaxial layer.

5. The semiconductor device as set forth in claim 1, wherein said second specific resistance is within a range of from 5 Ωcm to 100 Ωcm.

6. The semiconductor device as set forth in claim 1, wherein said first specific resistance is equal to or higher than 200 Ωcm.

7. The semiconductor device as set forth in claim 6, wherein said first specific resistance is equal to or higher than 500 Ωcm.

8. The semiconductor device as set forth in claim 1, further comprising:
   a printed circuit board having said semiconductor chip mounted thereon,
   wherein an interconnect of said printed circuit board is positioned such that no portion of the interconnect is directly in line with said inductor of said semiconductor chip in a vertical direction.

9. The semiconductor device as set forth in claim 8,
   wherein said semiconductor chip is flip-chip mounted to said printed circuit board through a bump, and
   wherein said bump is positioned such that no portion of said bump is directly in line with said inductor of said semiconductor chip in a vertical direction.

10. The semiconductor device as set forth in claim 9, further comprising:
    a first pad and a second pad, each of said first and second pads being provided on both of said semiconductor chip and said printed circuit board,
    wherein said bump interposes between said first and said second pads, and
    wherein said first and said second pads are each positioned such that no portion of either of said first and second pads are directly in line with said inductor chip in a vertical direction.

11. A semiconductor device, comprising:
    a plurality of semiconductor chips, each of said semiconductor chips comprised of
    a semiconductor substrate having a first specific resistance,
    a semiconductor layer provided on said semiconductor substrate and having a second specific resistance, said second specific resistance being lower than said first specific resistance, and
    an interconnect layer provided on said semiconductor layer provided with an inductor in said interconnect layer for transmitting or receiving a signal between the semiconductor chip and an external element,
    wherein the inductors of said semiconductor chips are inductively coupled.

12. The semiconductor device as set forth in claim 11, wherein said inductor is configured of interconnects in said interconnect layer, said interconnects being formed to have a coil-shape.

13. The semiconductor device as set forth in claim 11, wherein said semiconductor layer is an epitaxial layer.

14. The semiconductor device as set forth in claim 11, further comprising:
    a printed circuit board having said semiconductor chip mounted thereon,
    wherein an interconnect of said printed circuit board is positioned such that no portion of the interconnect is directly in line with said inductor of said semiconductor chip in a vertical direction.

15. The semiconductor device as set forth in claim 14,
    wherein said semiconductor chip is flip-chip mounted to said printed circuit board through a bump, and
    wherein said bump is positioned such that no portion of said bump is directly in line with said inductor of said semiconductor chip in a vertical direction.

16. The semiconductor device as set forth in claim 15, further comprising:
    a first pad and a second pad, each of said first and second pads being provided on both of said semiconductor chip and said printed circuit board,
    wherein said bump interposes between said first and said second pads, and
    wherein said first and said second pads are each positioned such that no portion of either of said first and second pads are directly in line with said inductor chip in a vertical direction.

17. A semiconductor device, comprising:
    a semiconductor chip, the semiconductor chip comprised of
    a semiconductor substrate having a first specific resistance,
    a semiconductor layer provided on said semiconductor substrate and having a second specific resistance, said second specific resistance being lower than said first specific resistance,
    an interconnect layer provided on said semiconductor layer provided with an inductor in said interconnect layer for transmitting or receiving a signal between the semiconductor chip and an external element; and
    a printed circuit board having said semiconductor chip mounted thereon,
    wherein an interconnect of said printed circuit board is positioned such that no portion of the interconnect is directly in line with said inductor of said semiconductor chip in a vertical direction.

18. The semiconductor device as set forth in claim 17, wherein said inductor is configured of interconnects in said interconnect layer, said interconnects being formed to have a coil-shape.

19. The semiconductor device as set forth in claim 17, wherein said semiconductor chip is flip-chip mounted to said printed circuit board through a bump, and wherein said bump is positioned such that no portion of said bump is directly in line with said inductor of said semiconductor chip in a vertical direction.

20. The semiconductor device as set forth in claim 19, further comprising:

a first pad and a second pad, each of said first and second pads being provided on both of said semiconductor chip and said printed circuit board, wherein said bump interposes between said first and said second pads, and wherein said first and said second pads are each positioned such that no portion of either of said first and second pads are directly in line with said inductor chip in a vertical direction.

* * * * *